US006372660B1

(12) United States Patent
Jeng

(10) Patent No.: US 6,372,660 B1
(45) Date of Patent: Apr. 16, 2002

(54) METHOD FOR PATTERNING A DUAL DAMASCENE WITH MASKED IMPLANTATION

(75) Inventor: Pei-Ren Jeng, Hsin-Chu (TW)

(73) Assignee: Macronix International Co., Ltd. (TW)

(*) Notice: Subject to any disclaimer, the term of this patent is extended or adjusted under 35 U.S.C. 154(b) by 0 days.

(21) Appl. No.: 09/725,068

(22) Filed: Nov. 29, 2000

(51) Int. Cl.[7] .................. H01L 21/31; H01L 21/496
(52) U.S. Cl. ........................ 438/766; 438/638
(58) Field of Search .................. 438/592, 638, 438/622, 766

(56) References Cited

U.S. PATENT DOCUMENTS

| | | | | |
|---|---|---|---|---|
| 6,110,826 A | * | 8/2000 | Lou et al. .................. | 438/674 |
| 6,124,216 A | * | 9/2000 | Ko et al. .................... | 438/766 |
| 6,171,951 B1 | * | 1/2001 | Lee et al. ................... | 438/640 |
| 6,204,168 B1 | * | 3/2001 | Naik et al. ................. | 438/638 |
| 6,236,117 B1 | * | 5/2001 | Ishigaki et al. ............ | 257/903 |

* cited by examiner

Primary Examiner—Michael S. Lebentritt
Assistant Examiner—Brad Smith
(74) Attorney, Agent, or Firm—Lowe Hauptman Gilman & Berner, LLP

(57) ABSTRACT

A substrate is provided, and a first dielectric layer is formed, thereon. Then a first photoresist layer is formed and defined on the first dielectric layer. Next, a dense region as an etched barrier layer is formed in the first dielectric layer by an ion implantation with photoresist layer as a mask. A second dielectric layer is formed on the first dielectric layer after the first photoresist layer is removed. Afterward forming a second photoresist layer on the second dielectric layer and defining a predetermined trench region to expose a partial surface of the second dielectric layer, wherein the partial surface of the second dielectric layer comprises the dense region. Subsequently, an etching process is performed by means of the second photoresist layer as an etched mask to etch through the second dielectric layer and the first dielectric layer until the substrate surface is exposed for patterning the dual damascene.

49 Claims, 9 Drawing Sheets

METHOD FOR PATTERNING A DUAL DAMASCENE WITH MASKED IMPLANTATION

BACKGROUND OF THE INVENTION

1. Field of the Invention

The present invention generally relates to a method to manufacture the multi-level interconnects of semiconductor devices, and more particularly to form a dual damascene.

2. Description of the Prior Art

Recently, the size of a semiconductor device has greatly been reduced and its structure has been highly integrated. When semiconductor devices of integrated circuits (IC) become highly integrated, the surface of the chips may not be supplied with enough area to make the interconnects. The requirement of matching interconnects increases when the devices shrink, many designs of integrated circuits have to use the dual damascene method. Moreover, it also uses the three-dimensional structure of multi-level interconnects at present in the deep sub-micron region, and inter-metal dielectric (IMD) as the dielectric material which is used to separate from each of the interconnects. A conducting wire which connects between the upper and the lower metal layers is called the via plug with in the semiconductor industry. In general, if an opening forms in the dielectric layer exposure to devices of the substrate in interconnects, it is called a via hole.

There are two methods for conventional via and interconnect processes, one method is that via and interconnect finish by oneself, wherein the method is that the dielectric is first formed on the metal layer, and then the photoresist layer (PR) is defined on the dielectric, and use the etching process to make the via, and deposit conduction material in the via by means of deposition to finish the via process, then deposit and define metal layer, afterward deposit the dielectric layer whereon. Conventional process forming the metal interconnect is that make the via window and the interconnect by means of two lithography process. Thus, it is need cumbrous steps of deposit and pattern. And yet, it will result in interconnects to be difficult patterned due to the multi layer connect layout is more daedal in the sub-quarter micron.

Hence, damascene interconnect structure is developed at present. According to particular of the process, it will compartmentalize three types, such as the single type, the dual type and the self-aligned type. The damascene is that etch the trench of interconnects in the dielectric, and then fill the metal as interconnect. This method can introduce metal that is difficult etched into the semiconductor without etching in the interconnect process. Therefore, this invention is the best method of the interconnect process in the sub-quarter micron.

Conventional dual damascene include two patterns, one is the deep patterns, that is the via patterns; another is the shallow patterns or the line patterns, that is the trench patterns. Conventional via first process for forming a dual damascene is shown as FIG. 1A to FIG. 1C, first of all, a first dielectric layer 110, an etching stop layer 120 and a second dielectric layer 130 are formed on the substrate 100 in order. Then a first photoresist layer 140 is formed on the second dielectric layer 130, and the first photoresist layer 140 is defined and patterned as a deep pattern area. Next, performing an etching process of the deep patterns by means of the first photoresist layer 140 as a etched mask, and then punching through the second dielectric layer 130, etching stop layer 120 and the first dielectric layer 110, while a via hole 150 is formed. After removing the first photoresist layer 140, a second photoresist layer 160 is formed on the second dielectric layer 130, and it is defined to form a shallow pattern area and expose the partial surface of the via hole 150 and the second dielectric layer 130 so that the horizontal size of the shallow patterns is large more then one of the deep patterns. Afterward performing an etching process of the shallow patterns by means of the second photoresist layer 160 as an etched mask and the etching stop layer 120 as an etching terminal point, so as to remove exposed partial surface of the second dielectric layer 130 and form a trench 170 having large horizontal size. Subsequently, the second photoresist layer 160 is removed to form the opening of the damascene 150 and 170. Final, proceed a interconnect process, since the above processes are well known in the prior art, which are not the focus of the present invention, hence will not be described in greater details.

Likewise, conventional trench first process for forming a dual damascene is shown as FIG. 2A to FIG. 2C, first of all, a first dielectric layer 210, an etching stop layer 220 and a second dielectric layer 230 are formed on the substrate 200 in order. Then a first photoresist layer 240 is formed on the second dielectric layer 230, and then it is defined to form a shallow pattern area and expose the partial surface of the second dielectric layer 230. Next, performing an etching process of the shallow patterns by means of the first photoresist layer 240 as an etched mask and the etching stop layer 220 as an etching terminal point, so as to remove exposed partial surface of the second dielectric layer 230 and form a trench 270. After removing the first photoresist layer 240, a second photoresist layer 260 is formed on the second dielectric layer 230 and the first dielectric layer 210, and then it is defined to form a shallow pattern area and expose the partial surface of the first dielectric layer 210 so that the horizontal size of the shallow patterns is large more then one of the deep patterns. Afterward performing an etching process of the deep patterns by means of the second photoresist layer 260 as an etched mask to form a trench 270 having a smaller horizontal size. Subsequently, the second photoresist layer 260 is removed to form the opening of the damascene 250 and 270. Final, proceed a interconnect process, since the above processes are well known in the prior art, which are not the focus of the present invention, hence will not be described in greater details.

Likewise, conventional embedded hard mask process for forming a dual damascene is shown as FIG. 3A to FIG. 3D, first of all, a first dielectric 310 and an embedded hard mask layer 320 are formed on the substrate 300 in order. Then a first photoresist layer 330 is formed on the embedded hard mask layer 320, and then it is defined to form a first predetermined etched area and expose the partial surface of the embedded hard mask layer 320. Next, performing an etching process by the first photoresist layer 330 as an etched mask to etch the first predetermined etched region and remove exposed partial surface of the embedded hard mask layer 320, and then form an etched region 340 on the first dielectric layer 310. After removing the first photoresist layer 330, a second dielectric layer 350 is formed on the first dielectric layer 310, and it is filled into the etched region 340. Subsequently, a second photoresist layer 360 is formed on the second dielectric layer 350 and it is defined to form a second predetermined etched region, which has the etched region 340, so that a partial surface of the second dielectric layer 350 is exposed. Afterward performing an etching process of the deep patterns by means of the second photoresist layer 360 as an etched mask to etch the second predetermined etched region, and then etching through the second dielectric layer 350 and the first dielectric layer 310, so as to form a trench 370 and a via hole 380. The second photoresist layer 360 is then removed to form the opening of the damascene 370 and 380. Final, proceed a interconnect process, since the above processes are well known in the prior art, which are not the focus of the present invention, hence will not be described in greater details.

The skill of the dual damascene is a method for forming via and interconnects. In the conventional dual damascene skill of above, it is necessary that the etching stop layer or the embedded hard mask have to be formed between two dielectric layers to perform the etching process. Therefore, there is a large fabricated cost due to the complex step for forming a dual damascene with conventional process. Moreover, performance of device is affected because the addition of etching stop layer or the embedded hard mask makes dielectric constant (K) to raise. Further, there are interface or adherence issues during forming multi-layer with various materials.

Furthermore, in the via first process, it is necessary that the dielectric layer has enough thickness, so as to avoid damaging semiconductor substrate during over-etching process for forming the via hole, but if the thickness of the dielectric layer is raised, the dielectric constant will be increased, and that device dimension, in sub-micron process, is difficult to be decreased. Hence, a protected layer, such as organic polymer, has to be added on the dielectric before forming the trench. Nevertheless, the organic material is difficult to remove so that process is very hard. Likewise, in the trench first process, there are depth of focus (DOF) issue or critical dimension (CD) issue that is difficult to control. On the other hand, both the etching process of the via first process and the trench first process is performed on the different surface, so that the process window is difficult to control after etching.

Furthermore, in the embedded hard mask process as above, if the selectivity between the embedded hard mask and the dielectric layer is not enough, the thickness of the dielectric layer will be raised. Therefore, the dielectric constant will also be increased. Moreover, there is a difference in height due to a raise in the thickness of the embedded hard mask, which will result in some issues, such as chemical mechanical polish (CMP) or a cap-fill that is difficult to control.

In accordance with the above description, a new and improved method for forming the dual damascene is therefore necessary, so as to raise the yield and quality of the follow-up process.

SUMMARY OF THE INVENTION

In accordance with the present invention, a new method for forming dual damascene process is provided that substantially overcomes drawbacks of above mentioned problems arise from the conventional methods.

Accordingly, it is an object of the present invention to provide a new method for forming the dual damascene. In the present invention, the etching process has only one time for forming the trench and the via hole at the same time, and that on the same surface, so as to control the process window and avoid the issues, such as DOF or CD. Therefore, the method of the present invention is effective in raising quality of the process.

Another object of the present invention is to provide a new method for patterning the dual damascene. In this invention, it is unnecessary to form the etched stop layer or embedded hard mask, so as to avoid increasing dielectric constant due to increased thickness of the dielectric layer or the addition of the etched stop layer. Accordingly, this invention can raise the performance of the logic circuit. Furthermore, the present invention can also prevent issues of interface or adherence. Therefore, the present invention can simplify the step of process to reduce cost in fabrication. Hence, the method of the present invention is easily able to conform to economic effect.

Still another object of the present invention is that provide a new method for patterning the dual damascene. In this invention, a dense region as an etched barrier layer is formed in the dielectric layer by an ion implantation, so as to substitute for the embedded hard mask or the etched stop layer in the conventional process. Hence, the method of this invention is suitable for use in the sub micron.

In accordance with the present invention, a new method for forming the dual damascene is disclosed. In one embodiment of the present invention, first of all, a substrate is provided, and a first dielectric layer is formed, thereon. Then a first photoresist layer is formed and defined on the first dielectric layer. Next, a dense region as an etched barrier layer is formed in the first dielectric layer by an ion implantation with photoresist layer as a mask. A second dielectric layer is formed on the first dielectric layer after the first photoresist layer is removed. Afterward forming a second photoresist layer on the second dielectric layer and defining a predetermined trench region to expose a partial surface of the second dielectric layer, wherein the partial surface of the second dielectric layer comprises the dense region. Subsequently, an etching process is performed by means of the second photoresist layer as an etched mask to etch through the second dielectric layer and the first dielectric layer until the substrate surface is exposed for patterning the dual damascene. Finally, removing the second photoresist layer and performing a interconnect process, since the above processes are well known in the prior art, which are not the focus of the present invention, hence will not be described in greater details.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Preferred embodiments of the present invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1A:
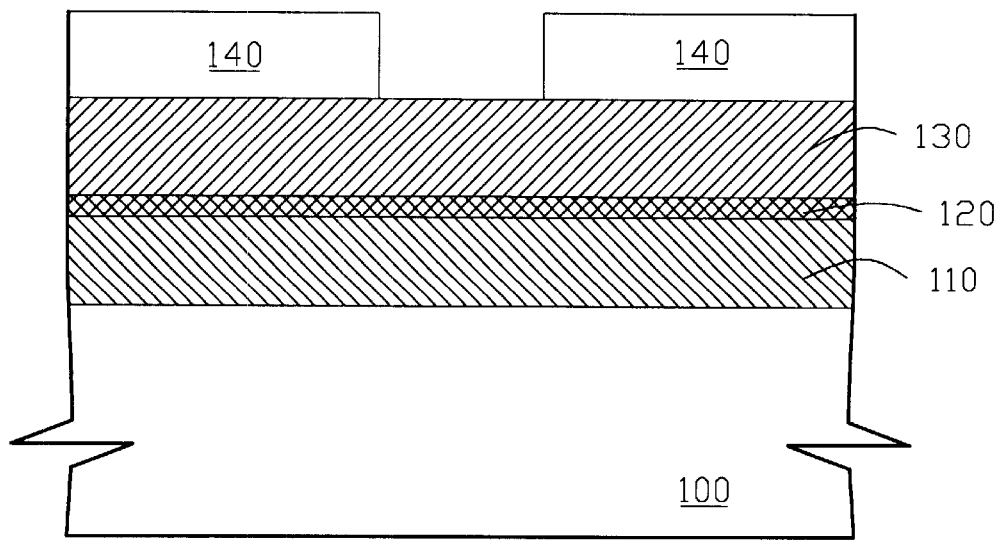
FIGS. 1A to 1C show cross-sectional views illustrative of various stages of conventional via first process in the dual damascene.
Figure 1B:
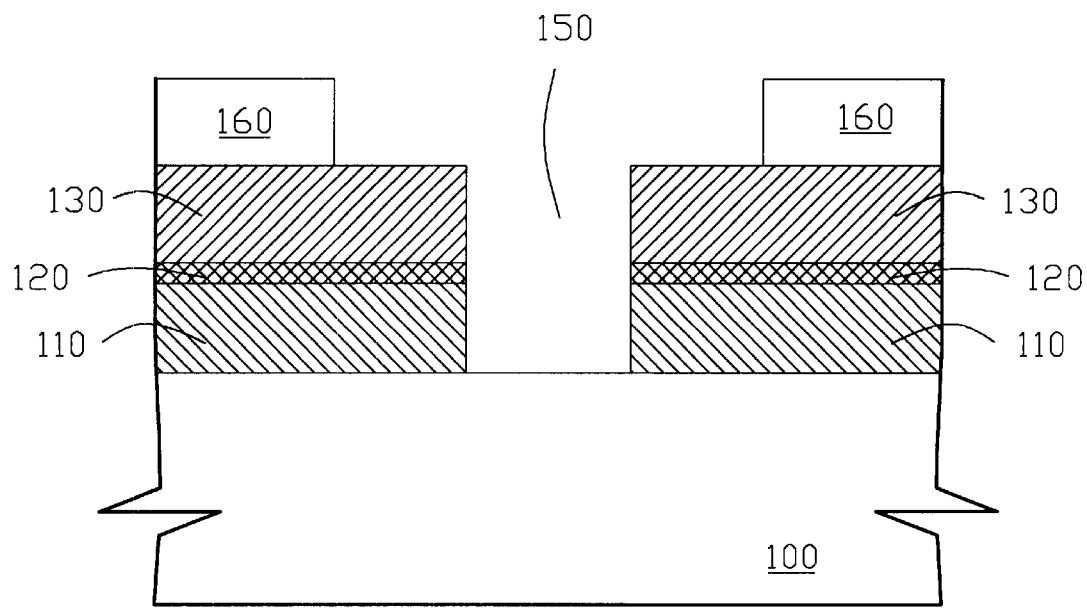
Figure 1C:
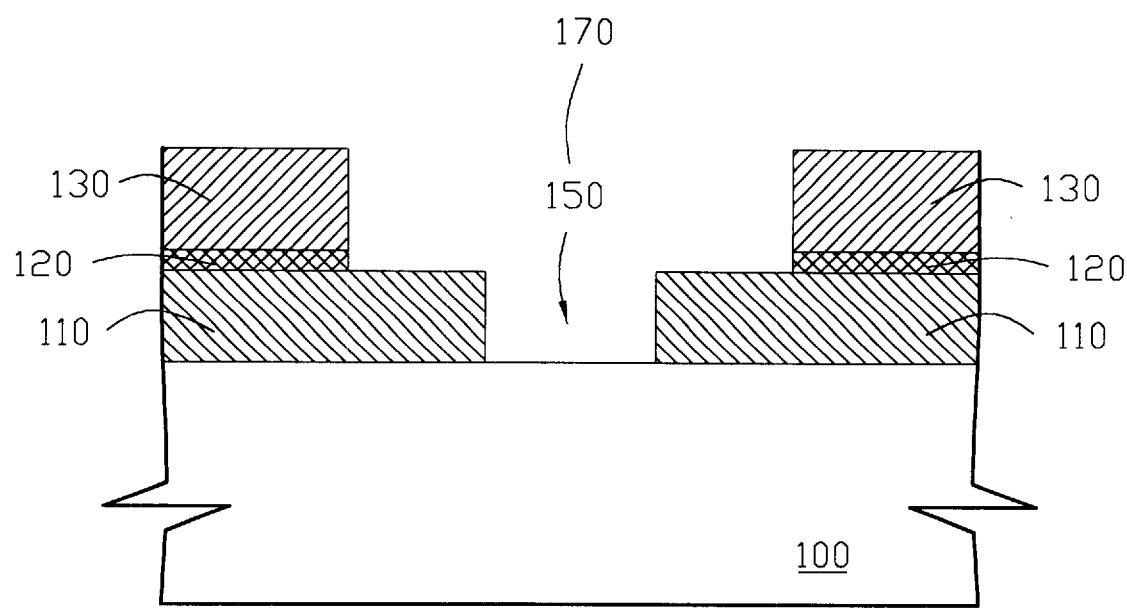
Figure 2A:
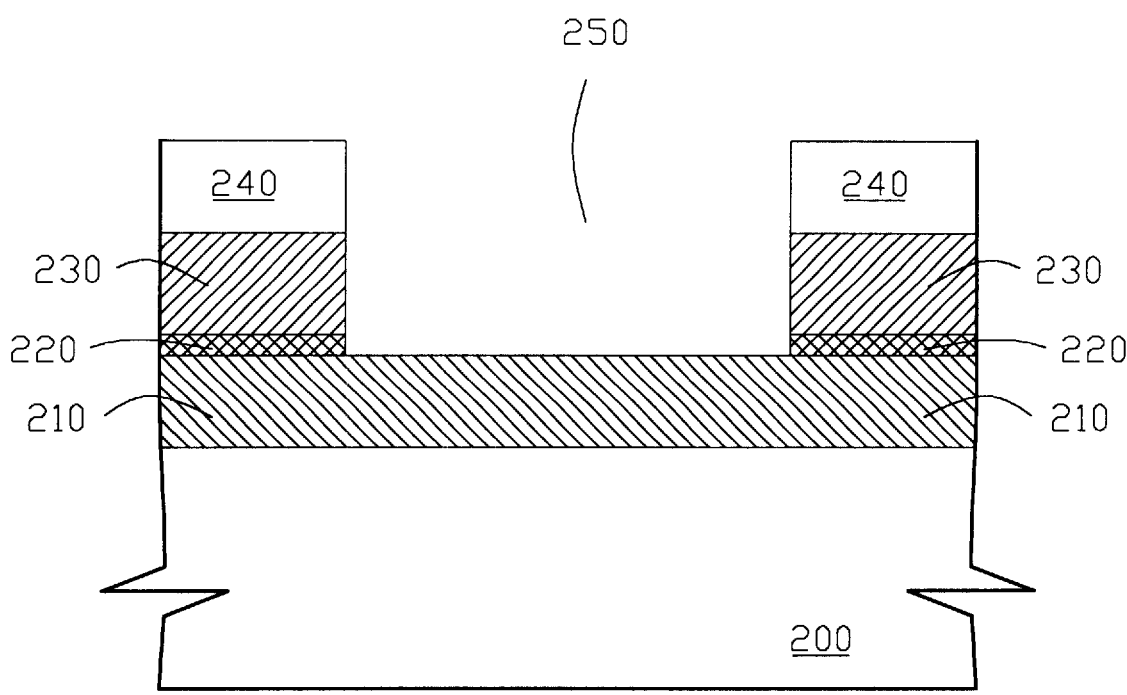
FIGS. 2A to 2C show cross-sectional views illustrative of various stages of conventional trench first process in the dual damascene.
Figure 2B:
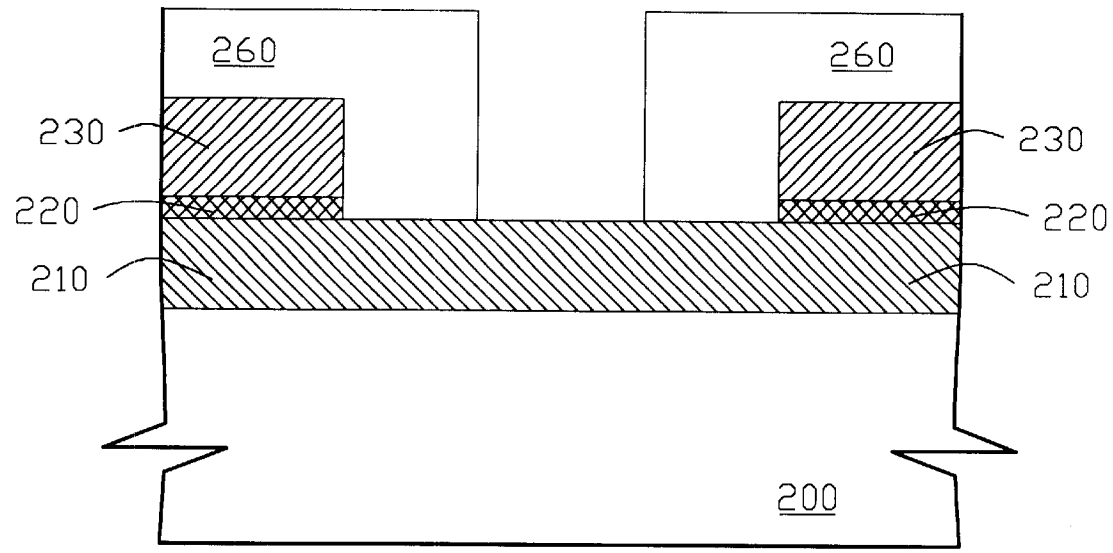
Figure 2C:
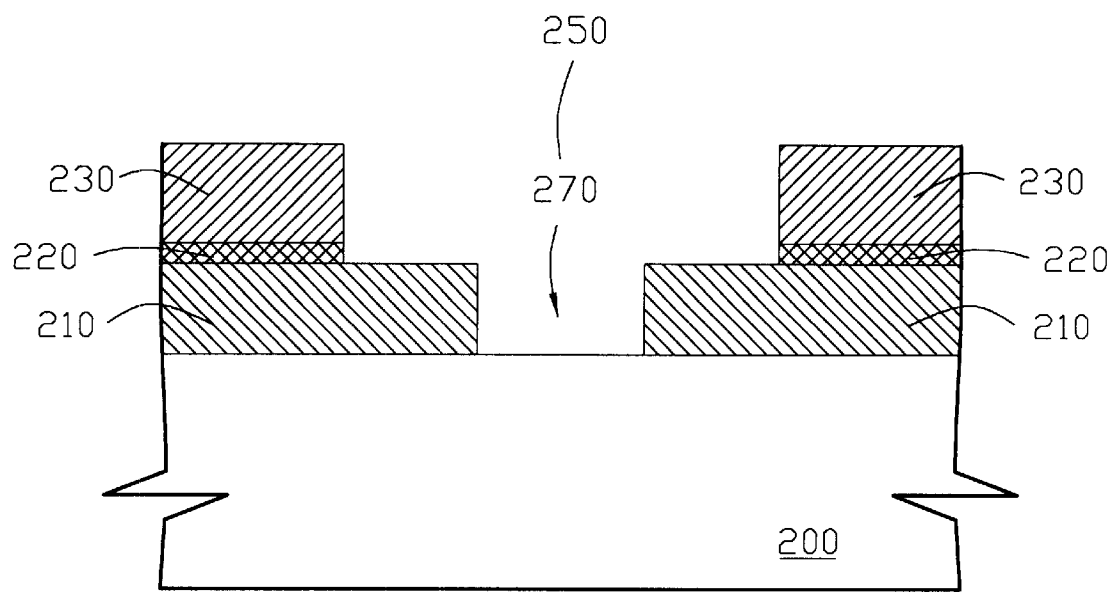
Figure 3A:
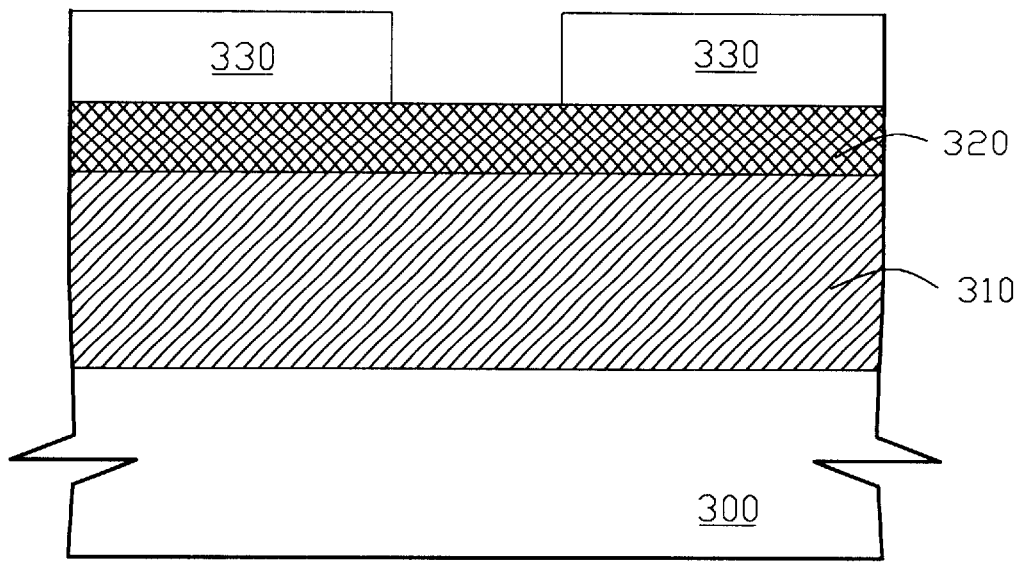
FIGS. 3A to 3D show cross-sectional views illustrative of various stages of conventional embedded hard mask process in the dual damascene.
Figure 3B:
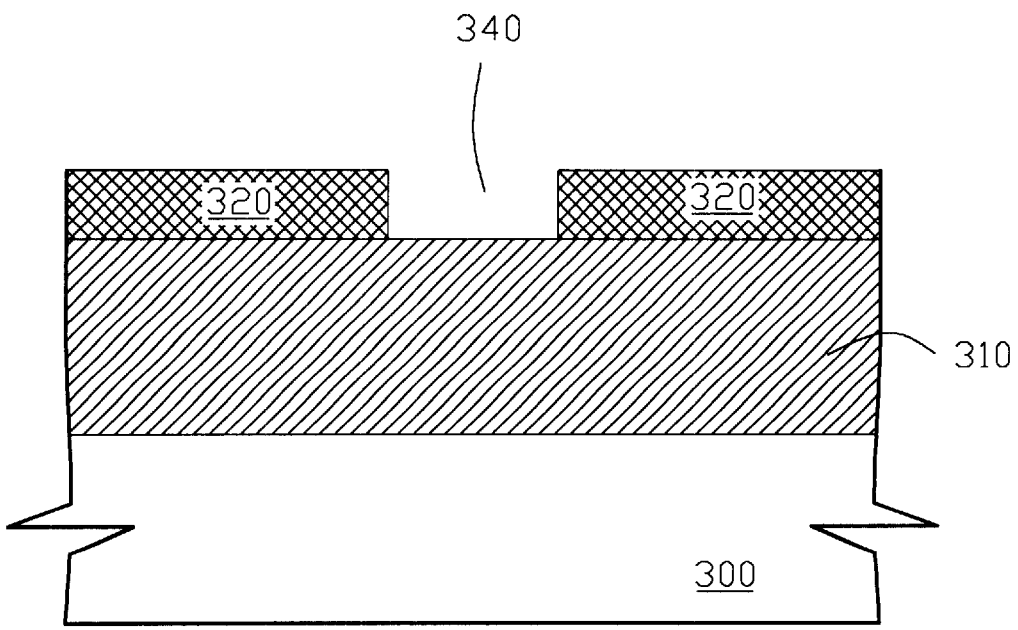
Figure 3C:
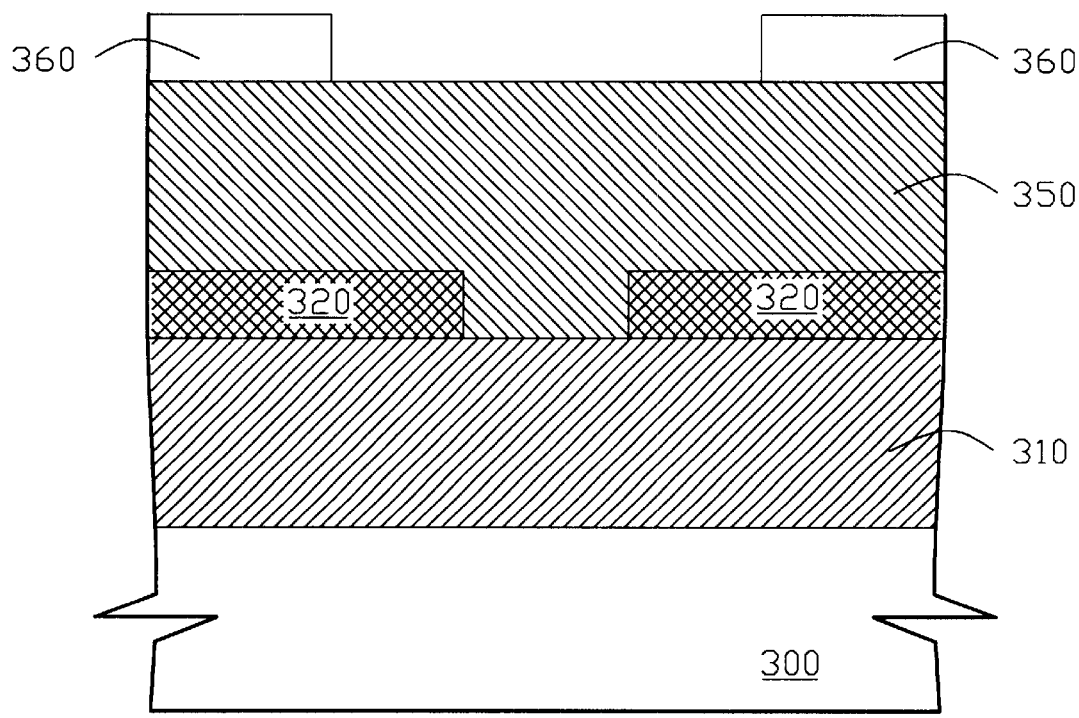
Figure 3D:
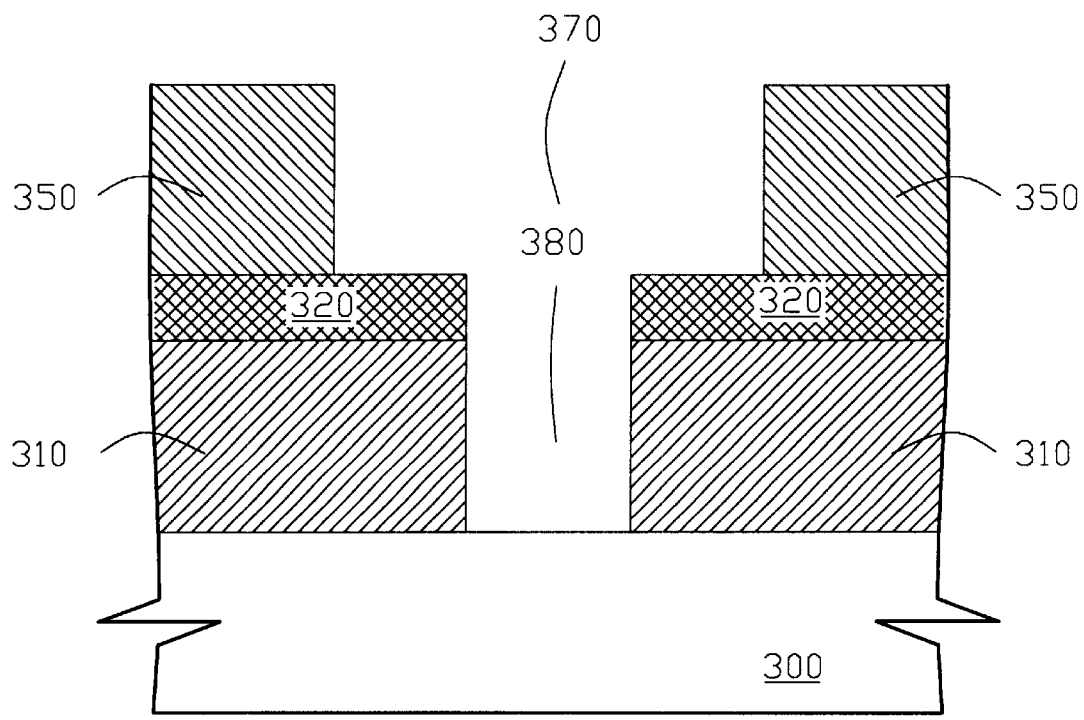
Figure 4A:
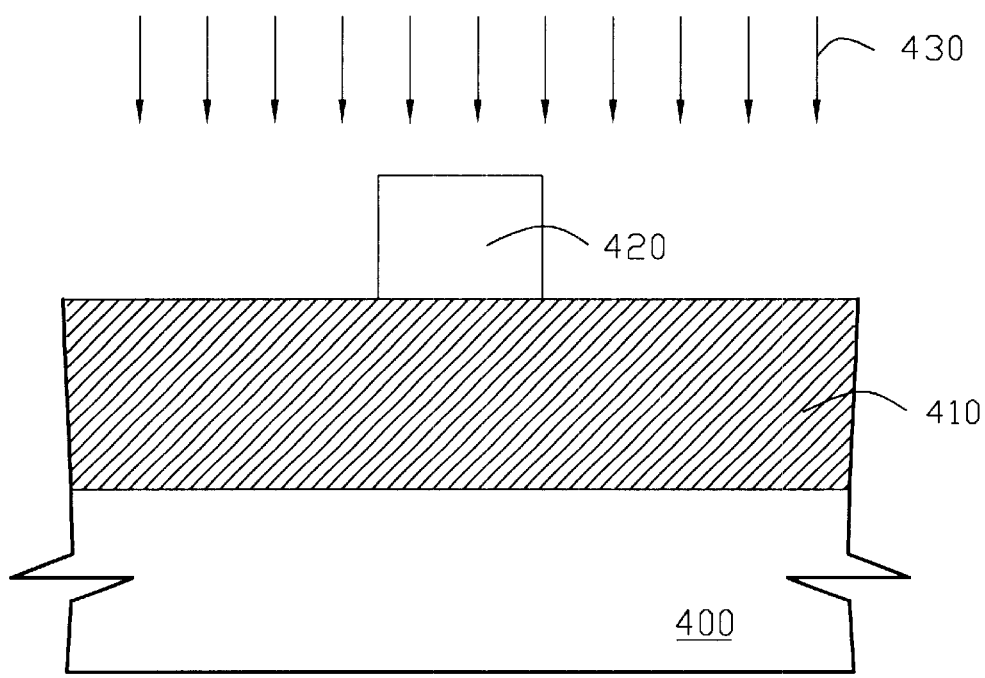
FIGS. 4A and 4B show cross-sectional views illustrative of various stages of the pattern method in the dual damascene in accordance with the first embodiment in this invention.
Figure 4B:
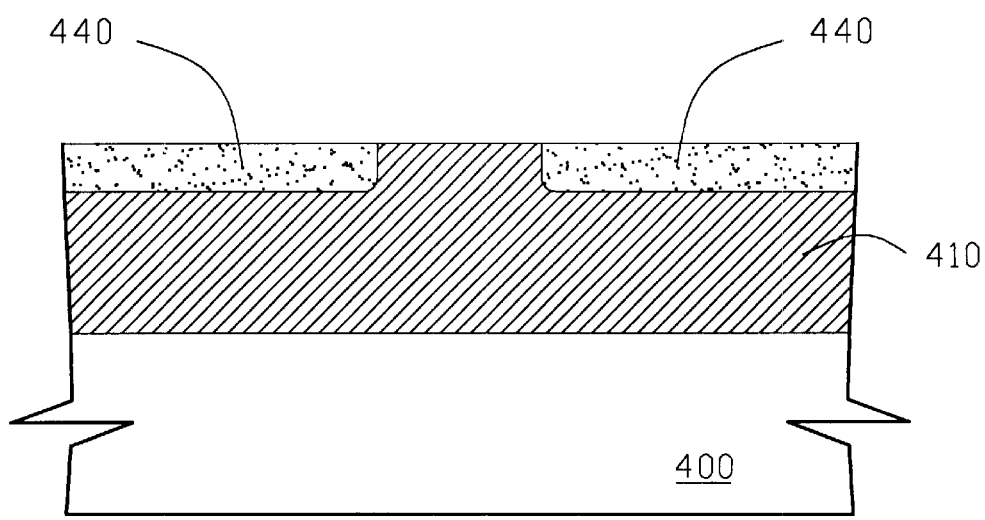

As illustrated in FIG. 4A and FIG. 4B, in the first embodiment of the present invention, first of all, a substrate 400 is provided and a dielectric layer 410 is formed over the substrate 400. Then a photoresist layer 420 is formed and defined on the dielectric layer 410. Next, a uniform dense region 440 is formed in the dielectric layer 410 by an ion implantation process 430 with the photoresist layer 420 as a mask. The ion implantation process 430 of above, which is a physical method, can bombard material with ions to change the material density, such as the uniform dense region 440, and it is as etched barrier layer in follow-up etching process. The ion implantation process 430 is a masked implantation that uses phosphorous (P), arsenic (As) or $BF_2$ ions, whose dosage is about between $10^{12}$ and $10^{15}$, with energy about between 20 KeV and 100 KeV. However, it should be noted that the ion implantation process 430 is not limited to implement the number of times and the conditions in above specific embodiment.

Figure 5A:
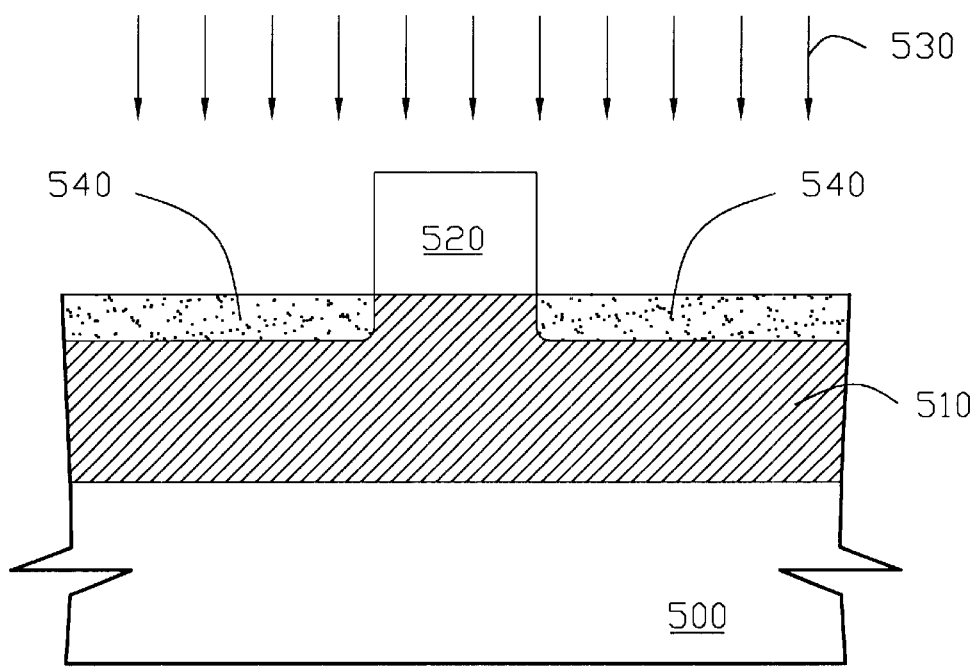
FIGS. 5A to 5C show cross-sectional views illustrative of various stages of the pattern method in the dual damascene in accordance with the second embodiment in this invention.

Referring to FIG. 5A, in the second embodiment of the present invention, first of all, a substrate 500 is provided, and a first dielectric layer 510 is deposited, thereon, wherein the batter material of the first dielectric layer 510 is a low-K dielectric material and the batter thickness of the first dielectric layer 510 is about 4000 to 6000 Å. Then a first photoresist layer 520 is formed and defined on the first dielectric layer 510. Next, a uniform dense region 540 as a etched barrier layer is formed in the first dielectric layer 510 by a masked implantation 530 and the first photoresist layer 520 as an ion implanted mask, wherein the thickness of the uniform dense region 540 is about 1000 Å to 2000 Å. The masked implantation 530 of above is performed by an ion, such as phosphorous (P), arsenic (As) or $BF_2$ ion, having dosage about $10^{12}$ to $10^{15}$.

Figure 5B:
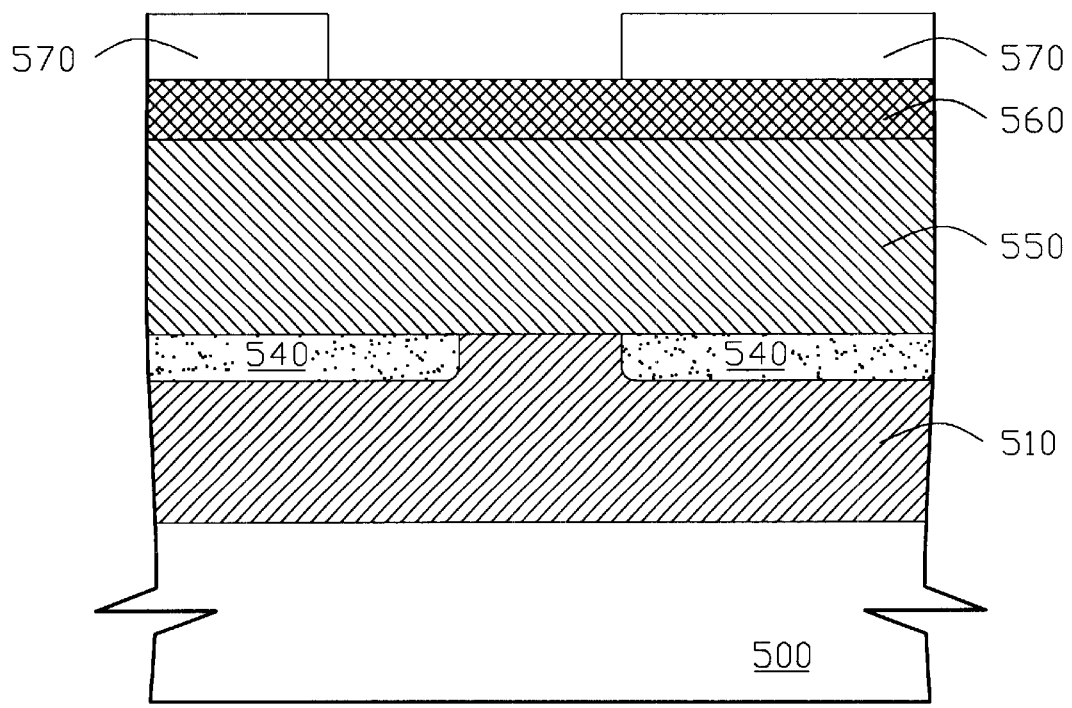
Figure 5C:
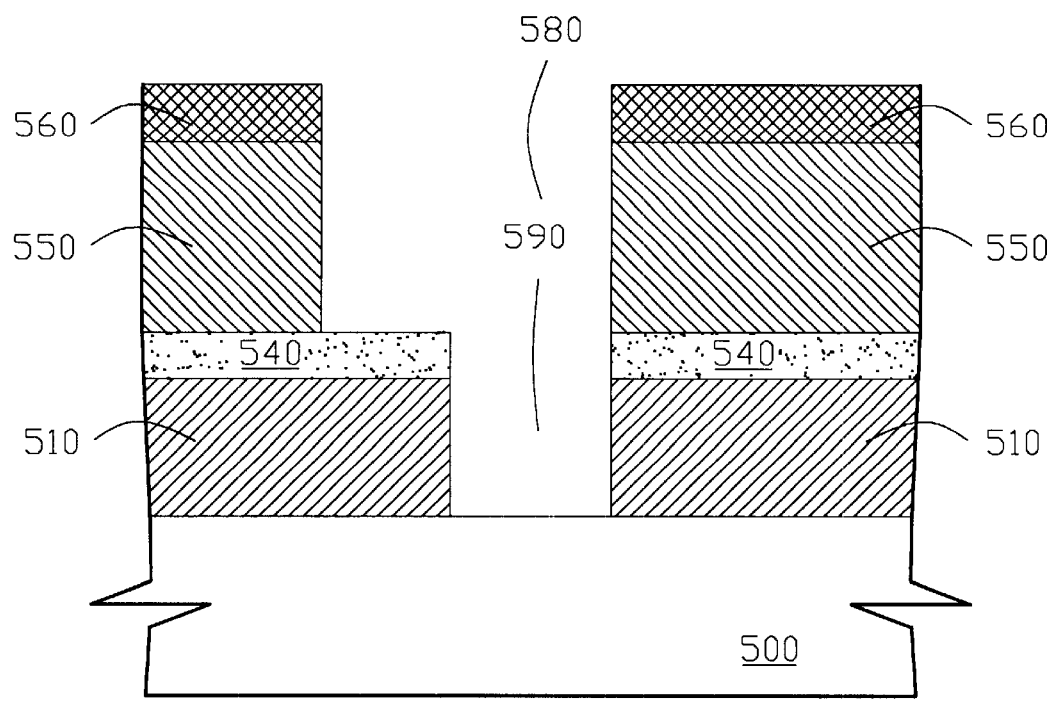

Referring to FIG. 5B, in this embodiment, a second dielectric layer 550 is deposited on the first dielectric layer 510 after the first photoresist layer 520 is removed, wherein the batter material of the second dielectric layer 550 is a low-K dielectric material and the batter thickness of the second dielectric layer 550 is about 4000 to 6000 Å. Afterward forming a hard mask layer 560 on the second dielectric layer 550, and then forming and defining a second photoresist layer 570 on the hard mask layer 560 to expose a partial surface of the hard mask layer 560 as a predetermined etched region, wherein the location of partial surface on the hard mask layer 560 comprises the location of uniform dense region 540. Subsequently, an etching process is performed by means of the second photoresist layer 570 as an etched mask to etch through the hard mask layer 560, the second dielectric layer 550 and the first dielectric layer 510 until surface of the substrate 500 is exposed for patterning the dual damascene. Final, removing the second photoresist layer 570 to form a trench 580 and a via hole 590 of the dual damascene, as shown in FIG. 5C.

Figure 6A:
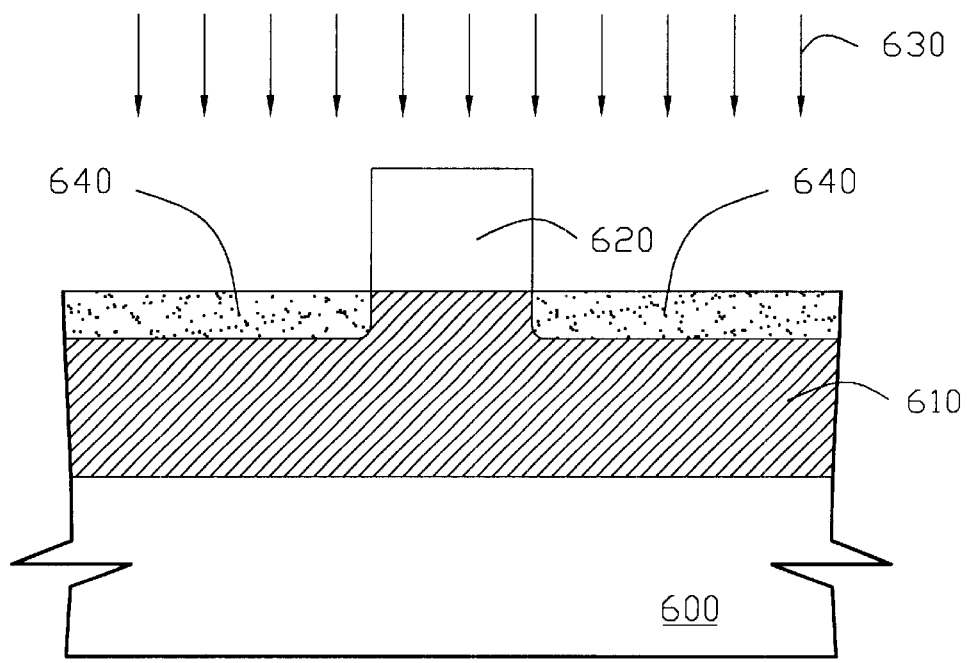
FIGS. 6A to 6C show cross-sectional views illustrative of various stages of the pattern method in the dual damascene in accordance with the third embodiment in this invention.

Referring to FIG. 6A, in the third embodiment of the present invention, first of all, a substrate 600 is provided, and a first dielectric layer 610 is deposited, thereon. Then a first photoresist layer 620 is formed and defined on the first dielectric layer 610. Next, an etched barrier layer 640 is formed in the first dielectric layer 610 by an ion implantation 630 and the first photoresist layer 620 as a mask.

Figure 6B:
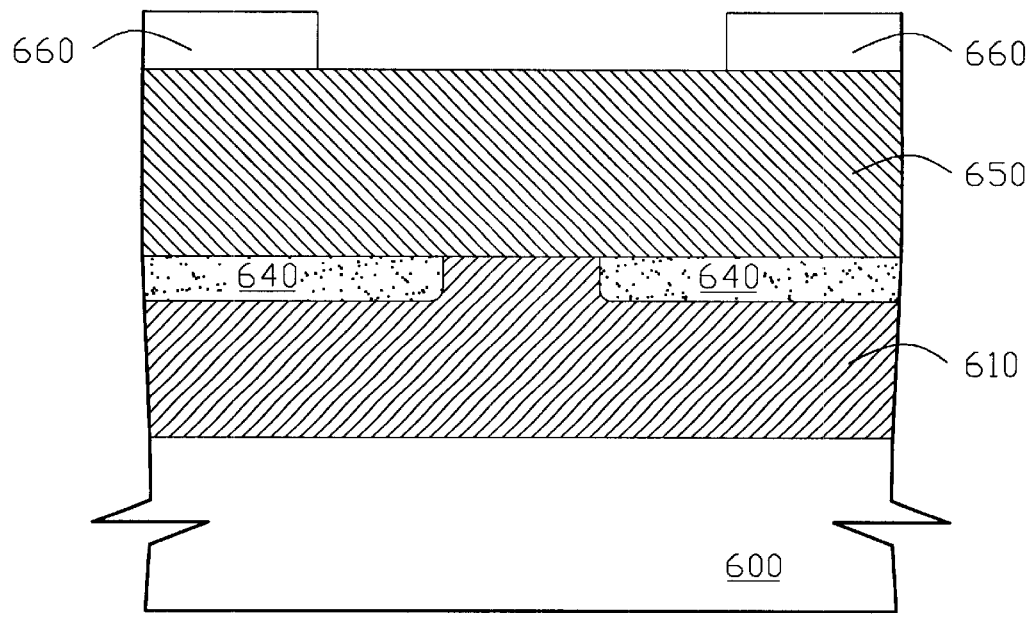
Figure 6C:
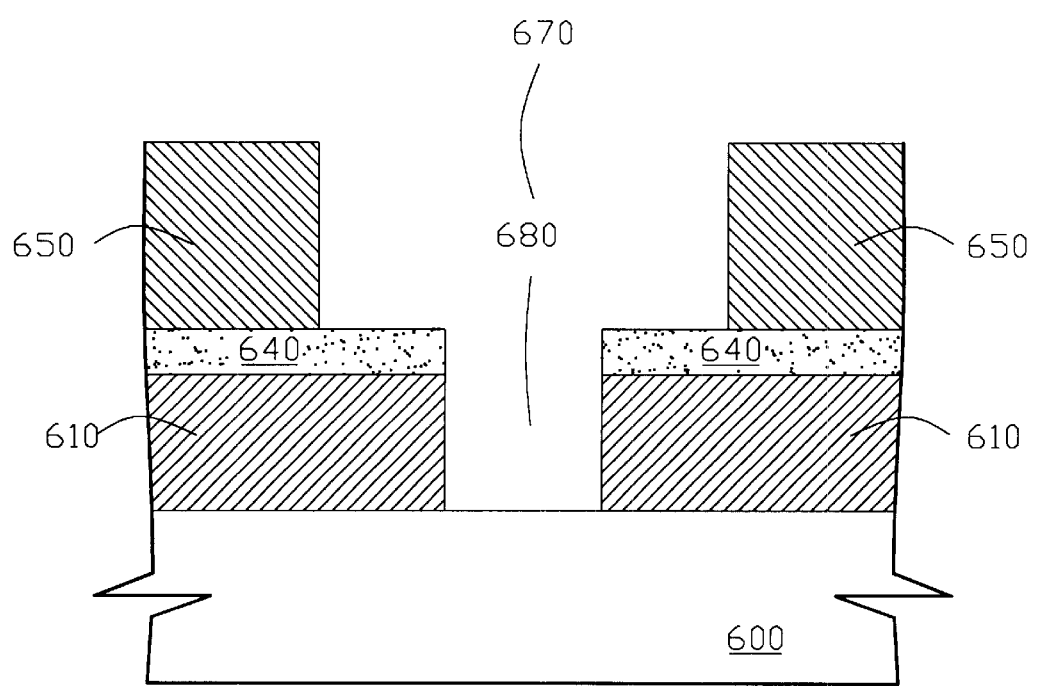

Referring to FIG. 6B, in this embodiment, a second dielectric layer 650 is formed on the first dielectric layer 610 after the first photoresist layer 620 is removed. Afterward forming and defining a second photoresist layer 660 on the second dielectric layer 650 to expose a partial surface of the second dielectric layer 650 as a predetermined etched region, wherein the location of partial surface on the second dielectric layer 650 comprises the location of the etched barrier layer 640. Subsequently, an etching process is performed by means of the second photoresist layer 660 as an etched mask to etch through the second photoresist layer 660 and the first dielectric layer 610 until surface of the substrate 600 is exposed for patterning the dual damascene. Finally, removing the second photoresist layer 660 to form a trench 670 and a via hole 680 of the dual damascene, as shown in FIG. 6C.

In these embodiments of the present invention, a new pattern method of the dual damascene is provided. The present invention uses the etching process with one time on the same surface, so as to control the process window and avoid the issues, such as DOF or CD. Hence, it is effective in raising quality of the process. Furthermore, it is unnecessary for forming the etched stop layer or the embedded hard mask, so as to avoid increasing dielectric constant due to increase the thickness of dielectric layer or the addition of the etched stop layer. Accordingly, this invention can raise performance of logic circuit. Moreover, the present invention can also prevent issues of interface or adherence. Therefore, it is possible to provide a highly reliable semiconductor device without the occurrence of deterioration of interconnects quality. Further, it can simplify step of process to reduce fabrication cost. In other words, the method of the present invention is easily and to conform to the economic effect. On the other hand, in this invention, a dense region as an etched barrier layer is formed in the dielectric layer by the masked implantation, so as to substitute for the embedded hard mask or the etched stop layer in the conventional process. Hence, the method of this invention is suitable for use in the sub micron. Of course, it is possible to apply the present invention to the patterned process in the dual damascene, and also it is possible to the present invention to the nature changed of materials in the semiconductor devices. Also, this invention can be applied to pattern process concerning the dual damascene process used for forming the trench and the via hole at the same time by masked implantation have not been developed at present. Method of the present invention is the best low-K dual damascene compatible process for deep sub-micro process.

Obviously, many modifications and variations of the present invention are possible in light of the above teachings. It is therefore to be understand that within the scope of the appended claims, the present invention may be practiced otherwise than as specifically described herein.

Although specific embodiments have been illustrated and described, it will be obvious to those skilled in the art that various modifications may be made without departing from what is intended to be limited solely by the appended claims.

What is claimed is:

1. A method for forming a dense region of a dielectric layer, comprising:

providing a substrate;

forming a dielectric layer on said substrate;

forming and defining a photoresist layer on said dielectric layer;

performing a masked implantation process by way of using said photoresist layer as a mask to form a dense region in said dielectric layer; and removing said photoresist layer.

2. The method according to claim 1, wherein said dielectric layer comprises a low-K dielectric material.

3. The method according to claim 1, wherein the method for forming said dielectric layer comprises a deposited process.

4. The method according to claim 1, wherein said masked implantation process comprises an ion having a dosage about $10^{12}$ to $10^{15}$.

5. The method according to claim 1, wherein said masked implantation process comprises a phosphorous ion.

6. The method according to claim 1, wherein said masked implantation process comprises an arsenic ion.

7. The method according to claim 1, wherein said masked implantation process comprises a $BF_2$ ion.

8. The method according to claim 1, wherein said masked implantation process comprises a energy about between 20 and 100 KeV.

9. A method for forming a dense region of a dielectric layer, comprising:
   providing a substrate;
   depositing a dielectric layer with about 4000 Å to 6000 Å on said substrate;
   forming and defining a photoresist layer on said dielectric layer;
   performing a masked implantation process with energy about 20 to 100 KeV by said photoresist layer as a mask, and implanting into said dielectric layer to form a dense region with about 1000 Å to 2000 Å in said dielectric layer; and
   removing said photoresist layer.

10. The method according to claim 9, wherein said masked implantation process comprises an ion having dosage about $10^{12}$ to $10^{15}$.

11. The method according to claim 9, wherein said masked implantation process comprises a phosphorous ion.

12. The method according to claim 9, wherein said masked implantation process comprises an arsenic ion.

13. The method according to claim 9, wherein said masked implantation process comprises a $BF_2$ ion.

14. A method for patterning a dual damascene, comprising:
   providing a substrate;
   forming a first dielectric layer on said substrate;
   forming and defining a first photoresist layer on said first dielectric layer;
   performing a masked implantation process with said first photoresist layer as a mask to form a dense region in said first dielectric layer;
   removing said first photoresist layer;
   forming a second dielectric layer on said first dielectric layer;
   forming and defining a second photoresist layer on said second dielectric layer to form a predetermined etched region;
   etching said predetermined etched region to form a pattern of said dual damascene in said predetermined etched region; and
   removing said second photoresist layer.

15. The method according to claim 14, wherein said first dielectric layer comprises a low-K dielectric material.

16. The method according to claim 14, wherein the method for forming said first dielectric layer comprises a deposited process.

17. The method according to claim 14, wherein said masked implantation process comprises an ion having a dosage about $10^{12}$ to $10^{15}$.

18. The method according to claim 14, wherein said masked implantation process comprises a phosphorous ion.

19. The method according to claim 14, wherein said masked implantation process comprises an arsenic ion.

20. The method according to claim 14, wherein said masked implantation process comprises a $BF_2$ ion.

21. The method according to claim 14, wherein said masked implantation process comprises an energy about between 20 and 100 KeV.

22. The method according to claim 14, wherein said second dielectric layer comprises a low-K dielectric material.

23. The method according to claim 14, wherein the method for forming said second dielectric layer comprises a deposited process.

24. The method according to claim 14, wherein the method for etching said predetermined etched region comprises:
   etching said predetermined etched region by said second photoresist layer as an etched mask; and
   etching through said second dielectric layer and said first dielectric layer until surface of said substrate is exposed by said dense region as an etched barrier layer to patterning said dual damascene.

25. The method according to claim 14, wherein said pattern comprises a trench.

26. The method according to claim 14, wherein said pattern comprises a via hole.

27. A method for forming a pattern of a dual damascene, comprising:
   providing a substrate;
   depositing a first dielectric layer on said substrate;
   forming and defining a first photoresist layer on said first dielectric layer;
   performing a masked implantation process with energy about 20 to 100 KeV by using an ion having a dosage about $10^{12}$ to $10^{15}$ and said first photoresist layer as a mask, and implanting into said first dielectric layer to form an etched barrier layer with a dense region in said first dielectric layer;
   removing said first photoresist layer;
   depositing a second dielectric layer on said first dielectric layer;
   forming a hard mask layer on said second dielectric layer;
   forming and defining a second photoresist layer on said hard mask layer to form a predetermined etched region;
   etching through said hard mask layer, said second dielectric layer and said first dielectric layer of said predetermined etched region until a partial surface of said substrate is exposed by said second photoresist layer as a etched mask to form said pattern of said dual damascene in said predetermined etched region; and
   removing said second photoresist layer.

28. The method according to claim 27, wherein the thickness of said first dielectric layer is about 4000 to 6000 Å.

29. The method according to claim 27, wherein said ion comprises a phosphorous ion.

30. The method according to claim 27, wherein said ion comprises an arsenic ion.

31. The method according to claim 27, wherein said ion comprises a $BF_2$ ion.

32. The method according to claim 27, wherein the thickness of said dense region is about 1000 Å to 2000 Å.

33. The method according to claim 27, wherein the thickness of said second dielectric layer is about 4000 to 6000 Å.

34. The method according to claim 27, wherein said pattern comprises a trench.

35. The method according to claim 27, wherein said pattern comprises a via hole.

36. A method for forming a pattern in a dual damascene process, comprising:

providing a substrate;

forming a first dielectric layer with about 4000 Å to 6000 Å on said substrate;

forming an etched barrier layer with a dense region in said first dielectric layer;

forming a second dielectric layer on said first dielectric layer;

forming and defining a photoresist layer on said second dielectric layer;

etching through said second dielectric layer and said first dielectric layer to form a trench and a via hole of said dual damascene by said etched barrier layer and said photoresist layer; and removing said photoresist layer.

37. The method according to claim 36, wherein said etched barrier layer comprises a dense region of said first dielectric layer.

38. The method according to claim 36, wherein the method for forming said dense region comprises an ion implantation process.

39. A method for forming a pattern in a dual damascene process, comprising:

providing a substrate;

forming a first dielectric layer with about 4000 Å to 6000 Å on said substrate;

forming a dense region with 1000 Å to 2000 Å in said first dielectric layer;

forming a second dielectric layer with about 4000 Å to 6000 Å on said first dielectric layer;

forming and defining a photoresist layer on said second dielectric layer;

etching through said second dielectric layer and said first dielectric layer to form a trench and a via hole of said dual damascene by said dense region as an etched barrier layer and said photoresist layer; and removing said photoresist layer.

40. The method according to claim 39, wherein the method for forming said dense region comprises a masked implantation process.

41. The method according to claim 40, wherein said masked implantation process comprises an energy about between 20 and 100 KeV.

42. The method according to claim 40, wherein said masked implantation process comprises a dosage about $10^{12}$ to $10^{15}$.

43. The method according to claim 40, wherein said masked implantation process comprises a phosphorous ion.

44. The method according to claim 40, wherein said masked implantation process comprises an arsenic ion.

45. The method according to claim 40, wherein said masked implantation process comprises a $BF_2$ ion.

46. A method for forming a pattern in a dual damascene process, comprising:

providing a substrate;

forming a first dielectric layer with about 4000 Å to 6000 Å on said substrate;

forming and defining a first photoresist layer on said first dielectric layer;

performing a masked implantation process with an energy about between 20 and 100 KeV and a dosage about $10^{12}$ to $10^{15}$ by way of using said first photoresist layer as an implanted mask to form a dense region with 1000 Å to 2000 Å in said first dielectric layer;

removing said first photoresist layer;

forming a second dielectric layer with about 4000 Å to 6000 Å on said first dielectric layer;

forming and defining a second photoresist layer on said second dielectric layer;

etching through said second dielectric layer and said first dielectric layer to form a trench and a via hole of said dual damascene by said dense region as an etched barrier layer and said second photoresist layer; and removing said second photoresist layer.

47. The method according to claim 46, wherein said masked implantation process comprises a phosphorous ion.

48. The method according to claim 46, wherein said masked implantation process comprises an arsenic ion.

49. The method according to claim 46, wherein said masked implantation process comprises a $BF_2$ ion.

* * * * *